United States Patent
Tsunemasu

(10) Patent No.: US 6,787,924 B2
(45) Date of Patent: Sep. 7, 2004

(54) SEMICONDUCTOR DEVICE CAPABLE OF PREVENTING SOLDER BALLS FROM BEING REMOVED IN REINFORCING PAD

(75) Inventor: Kimio Tsunemasu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/073,196

(22) Filed: Feb. 13, 2002

(65) Prior Publication Data

US 2002/0109239 A1 Aug. 15, 2002

(51) Int. Cl.[7] .............................................. H01L 29/40
(52) U.S. Cl. ..................... 257/780; 257/772; 257/777; 257/778; 257/779
(58) Field of Search ............................. 257/780, 779, 257/772, 777, 778, 737, 738, 786; 438/613–617; 228/180.22

(56) References Cited

U.S. PATENT DOCUMENTS

| | | | | |
|---|---|---|---|---|
| 5,468,655 A | * | 11/1995 | Greer ............................ | 438/15 |
| 5,578,527 A | * | 11/1996 | Chang et al. .............. | 156/273.9 |
| 5,846,366 A | * | 12/1998 | Jin et al. ..................... | 156/233 |
| 5,955,784 A | * | 9/1999 | Chiu ........................... | 257/737 |
| 6,066,551 A | * | 5/2000 | Satou et al. ................ | 438/613 |
| 6,144,091 A | * | 11/2000 | Washida ..................... | 257/690 |
| 6,201,305 B1 | * | 3/2001 | Darveaux et al. .......... | 257/779 |
| 6,222,738 B1 | * | 4/2001 | Maeno et al. .............. | 361/772 |
| 6,291,897 B1 | * | 9/2001 | Wark et al. ................. | 257/786 |
| 6,324,754 B1 | * | 12/2001 | DiStefano et al. ..... | 228/180.22 |
| 6,444,563 B1 | * | 9/2002 | Potter et al. ................ | 438/615 |
| 6,627,988 B2 | * | 9/2003 | Andoh ........................ | 257/706 |
| 2002/0043726 A1 | * | 4/2002 | Salman et al. .............. | 257/778 |
| 2002/0089057 A1 | * | 7/2002 | Ikegami ...................... | 257/734 |

FOREIGN PATENT DOCUMENTS

| | | | |
|---|---|---|---|
| JP | 05-082735 | * | 2/1993 |
| JP | 06-180460 | * | 6/1994 |
| JP | 11-288978 | | 10/1999 |
| JP | 2000-200854 | | 7/2000 |

* cited by examiner

Primary Examiner—Kamand Cuneo
Assistant Examiner—James M. Mitchell
(74) Attorney, Agent, or Firm—Young & Thompson

(57) ABSTRACT

In a semiconductor device having CSP structure, reinforcing pads are provided on corners of the mounting surface of the CSP body portion, and a plurality of solder balls are mounted on the reinforcing pads, respectively. Each of the reinforcing pads has a periphery adjacent to each of the solder balls mounted thereon that is at least semicircular, when seen in plan view. This structure avoids acute angle portions which mechanical stress is concentrated. As a result, peeling of solder balls from the reinforcing pad can be reduced.

7 Claims, 5 Drawing Sheets

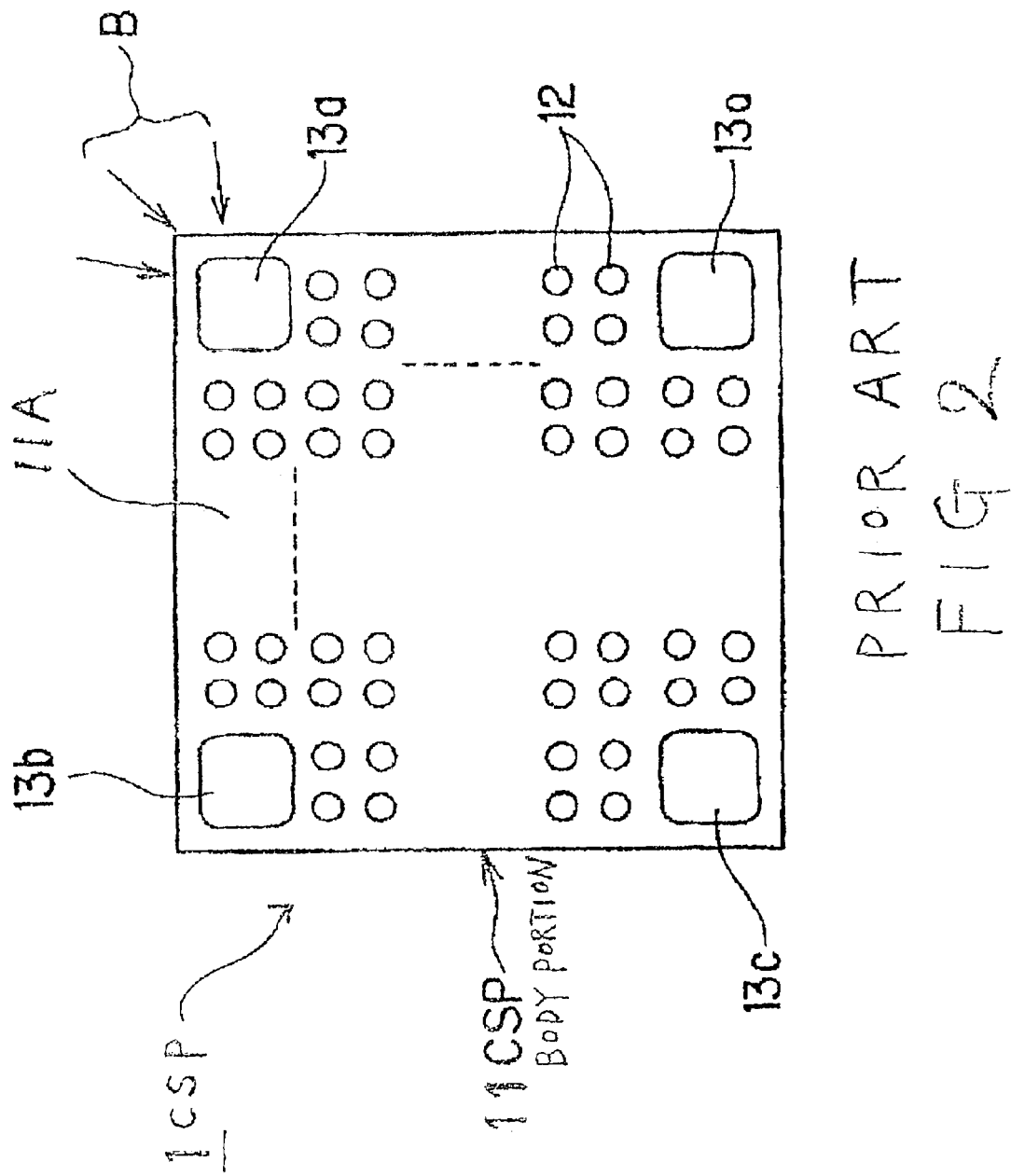

SEMICONDUCTOR DEVICE CAPABLE OF PREVENTING SOLDER BALLS FROM BEING REMOVED IN REINFORCING PAD

BACKGROUND OF THE INVENTION

The present invention relates to a semiconductor device, in particular to a semiconductor device which is capable of preventing solder junction planes of solder balls from being removed therefrom even though mechanical stress is applied to reinforcing pads provided on the four corners of CSP (Chip Size Package).

Conventionally, the CSP, which is efficiently mounted as an LSI (large scale integration) circuit, is mounted on a printed wiring substrate by soldering in a handy equipment, such as a personal telephone, and the like. In such a case, when the handy equipment using the CSP is dropped or an input key of the handy equipment using the CSP is pushed on, mechanical stress is inevitably caused in solder junction portions of the CSP due to a twist or a bend thereof. The mechanical stress is then applied to the printed wiring substrate. Stress is thereby generated in solder junction portions of the corner portions of the CSP. In order to increase strength of the corner portions to prevent the stress from being generated therein, reinforcing pads (PAD) consisting of copper chip patterns are conventionally formed on predetermined portions of the printed wiring substrate with the reinforcing pads (PAD) facing the corner portions of the CSP.

As will later be described more in detail, a first conventional semiconductor device using the CSP comprises a CSP body portion and a plurality of solder balls formed on a lower surface of the CSP body portion at predetermined pitches. The CSP is mounted on a printed wiring substrate by connecting the solder balls to conductor patterns on the printed wiring substrate by the use of soldering.

The reinforcing pads are formed, for example, on the four corners of the lower surface of the CSP body portion. A plurality of the solder balls, which are formed on the lower surface of the CSP body portion at predetermined pitches, are also mounted on each of the reinforcing pads, respectively. The reinforcing pads improve connection strength of the solder balls by increase of soldered areas. As a result, the reinforcing pads can release stress applied on soldered portions around the reinforcing pads, respectively.

However, in the first conventional semiconductor device mentioned above, when mechanical stress is applied near the reinforcing pads, the mechanical stress (tension stress) is applied on the reinforcing pads. In particular, when the mechanical stress is concentrated on an edge portion of the reinforcing pads, the solder balls are inevitably removed therein (junction plane by soldering is removed).

An example of a second conventional semiconductor device is exemplified in unexamined Japanese patent publication No.2000-200854. In the example, the second conventional semiconductor device has some features in order to improve reliability of soldering connection between CSP and a printed wiring substrate and to enable the second conventional semiconductor device to be contained in a conveyer tray without damaging solder bumps. For example, bump-less pads having no solder bump are provided on the corners of the CSP in the example. Further, solder balls for reinforcing are provided in the positions facing the bump-less pads on the printed wiring substrate. Herein, each of the solder balls has a diameter larger than that of a solder bump provided in the CSP side. In mounting processes, when the CSP and the printed wiring substrate are junctioned and then subjected to a reflow process, an adhered area of each solder ball for reinforcing having the larger diameter is enlarged, compared with the other solder balls each having a smaller diameter. Accordingly, mounting strength is thereby increased.

Further, an example of a third conventional semiconductor device is also exemplified in unexamined Japanese patent publication Hei1-288978, namely No.288978/1999. In the example, in order to improve mounting strength in mounting the third conventional semiconductor device on a mother substrate, recess portions are provided on the four corners of an interposer substrate. In addition, electrodes are formed in the four corners of the interposer substrate, respectively. The electrodes are then connected to be a pad formed on the mother substrate by soldering.

However, in the second conventional semiconductor device exemplified in the unexamined Japanese patent publication No.2000-200854, it is necessary to provide solder bumps both on the CSP and on the printed wiring substrate. Manufacturing processes thereby become complicated.

On the other hand, in the third conventional semiconductor device exemplified in the unexamined Japanese patent publication Hei1-288978, namely No.288978/1999, it is necessary to form the electrodes, respectively on the four corners of the interposer substrate. In addition, it is also necessary to conduct the soldering process between the electrodes and the pads on the mother substrate.

SUMMARY OF THE INVENTION

It is therefore an object of the present invention to provide a semiconductor device which is capable of reducing remove of solder balls in a reinforcing pad by preventing mechanical stress from being concentrated on a part of the reinforcing pad.

Other objects of the present invention will become clear as the description proceeds.

According to an aspect of the present invention, there is provided a semiconductor device which is mounted on a principle surface of a substrate to be connected with a circuit formed on the principle surface, the semiconductor device comprising: a body portion having a mounting surface; a plurality of solder balls which are formed on the mounting surface and which connect the semiconductor device to the principle surface of the substrate; a reinforcing pad provided on the mounting surface and having portions on which the a plurality of solder balls are positioned; and circumferential shapes of the portions on which the a plurality of solder balls are positioned being hemmed to have roundness in line with outer diameters of the a plurality of solder balls, respectively.

The circumferential shapes of the portions on which the a plurality of solder balls are positioned may be hemmed at least halfway round each of the a plurality of solder balls.

The reinforcing pad may have a cross shape, an X-shape, an L-shape, or a V-shape.

The body portion may be CSP (Chip Size Package).

BRIEF DESCRIPTION OF THE DRAWINGS

FIG. 2 is a bottom view for schematically showing the CSP of the first conventional semiconductor device using the CSP;

DETAILED DESCRIPTION OF THE PREFERRED EMBODIMENT

Referring now to FIGS. 1 through 4, description is, at first, made about a conventional semiconductor device in order to facilitate an understanding of the present invention.

Figure 1:
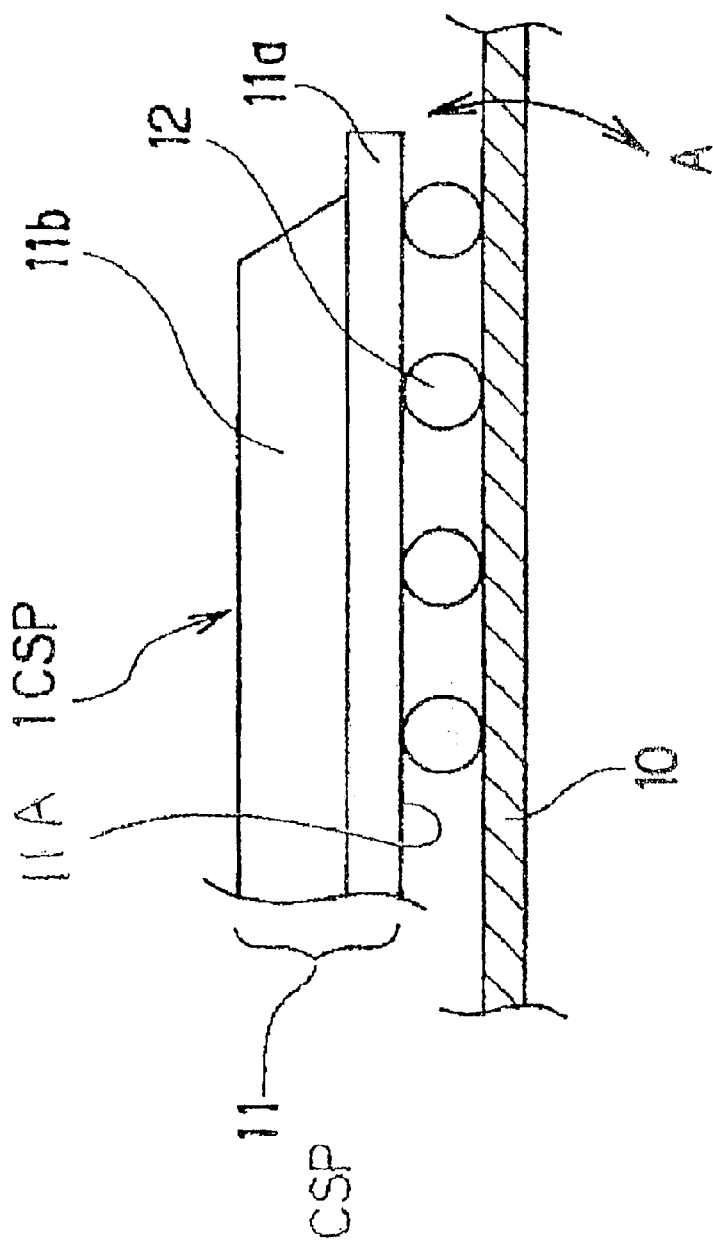
FIG. 1 is a partially sectional view for schematically showing a first conventional semiconductor device using the CSP.

In FIG. 1, illustrated is the first conventional semiconductor device using the CSP.

As mentioned in the preamble of the instant specification, the CSP 1 comprises a CSP body portion 11 and a plurality of solder balls 12 formed on a lower surface 11A of the CSP body portion 11 at predetermined pitches. The CSP 1 is mounted on a printed wiring substrate 10 by connecting the solder balls 12 to conductor patterns (not shown in FIG. 1) on the printed wiring substrate 10 by the use of soldering.

The CSP body portion 11 includes, for example, an LSI (Large Scale Integration) chip (not shown in FIG. 1), an organic frame 11a on which the LSI chip is mounted, and a molding resin 11b for molding the LSI chip.

In FIG. 2, illustrated is a plane of the CSP 1 of FIG. 1, in which the solder balls 12 are formed.

As illustrated in FIG. 2, reinforcing pads 13a, 13b, 13c and 13d are formed on the four corners of the lower surface 11A of the CSP body portion 11. A plurality of the solder balls 12, which are formed on the lower surface 11A of the CSP body portion 11 at predetermined pitches, as mentioned above, are also mounted on each of the reinforcing pads 13a, 13b, 13c, and 13d, respectively.

Figure 3A:
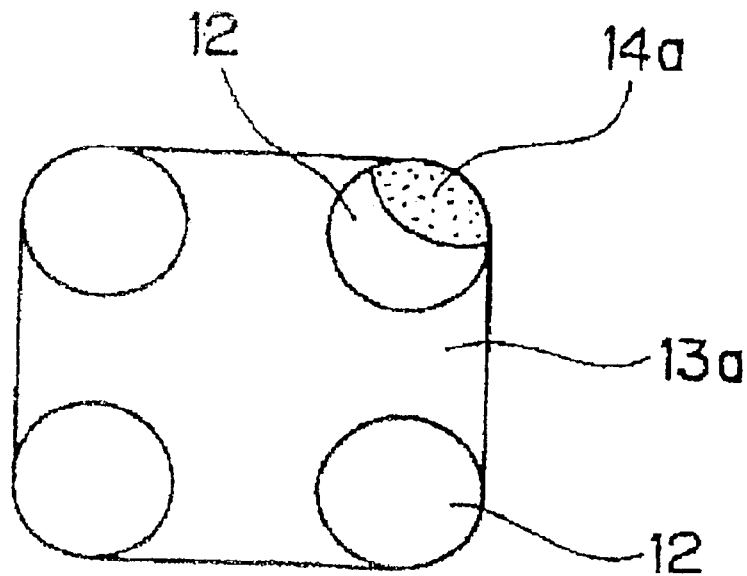
FIG. 3A is a view for schematically showing a reinforcing pad 13a consisting of a regular square in the first conventional semiconductor device using the CSP.
Figure 3B:
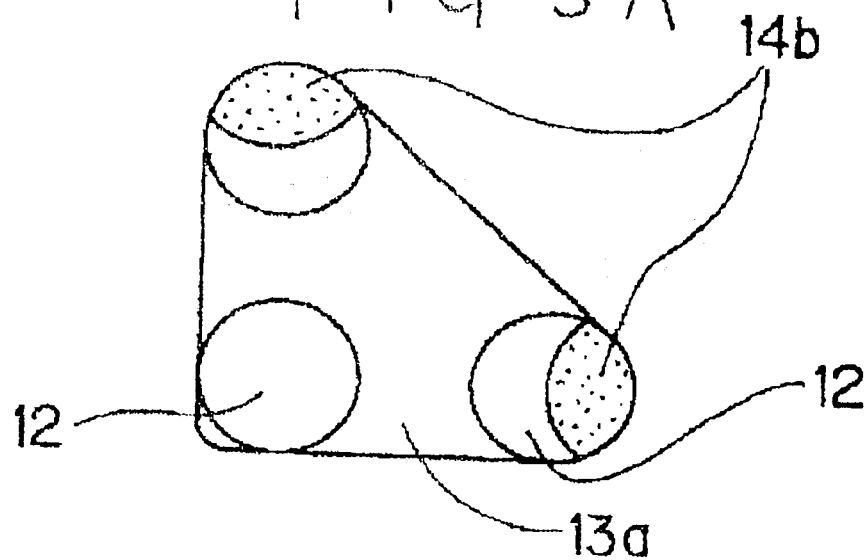
FIG. 3B is a view for schematically showing a reinforcing pad 13a consisting of a right-angled triangle in the first conventional semiconductor device using the CSP.

In FIGS. 3A and 3B, illustrated are detailed structures of the reinforcing pad 13a as one of the reinforcing pads 13a through 13d shown in FIG. 2. FIG. 3A shows the reinforcing pad 13a consisting of a regular square. As illustrated in FIG. 3A, total four solder balls 12 are provided on the four corners of the reinforcing pad 13a, respectively. On the other hand, FIG. 313 shows the reinforcing pad 13a consisting of a right-angled triangle. As illustrated in FIG. 3B, total three solder balls 12 are provided on the three corners of the reinforcing pad 13a, respectively. The other reinforcing pads 13b, 13c, and 13d, have the same structures, respectively, similar to that of the reinforcing pad 13a illustrated in FIGS. 3A and 3B. These reinforcing pads 13a through 13d improve connection strength of the solder balls 12 by increase of soldered areas. As a result, the reinforcing pads 13a through 13d can release stress applied on soldered portions around the reinforcing pads 13a, 13b, 13c, and 13d, respectively.

However, in the first conventional semiconductor device mentioned above, when mechanical stress is applied, for example, near the reinforcing pad 13a front the directions shown by an arrow A in FIG. 1, the mechanical stress (tension stress) is applied on the reinforcing pad 15a. In particular, when stress (mechanical stress B shown in FIG. 2) is concentrated on an edge portion of the reinforcing pad 13a, the solder balls 12 are inevitably removed (peeled off) therein (junction plane by soldering is removed).

Figure 4:
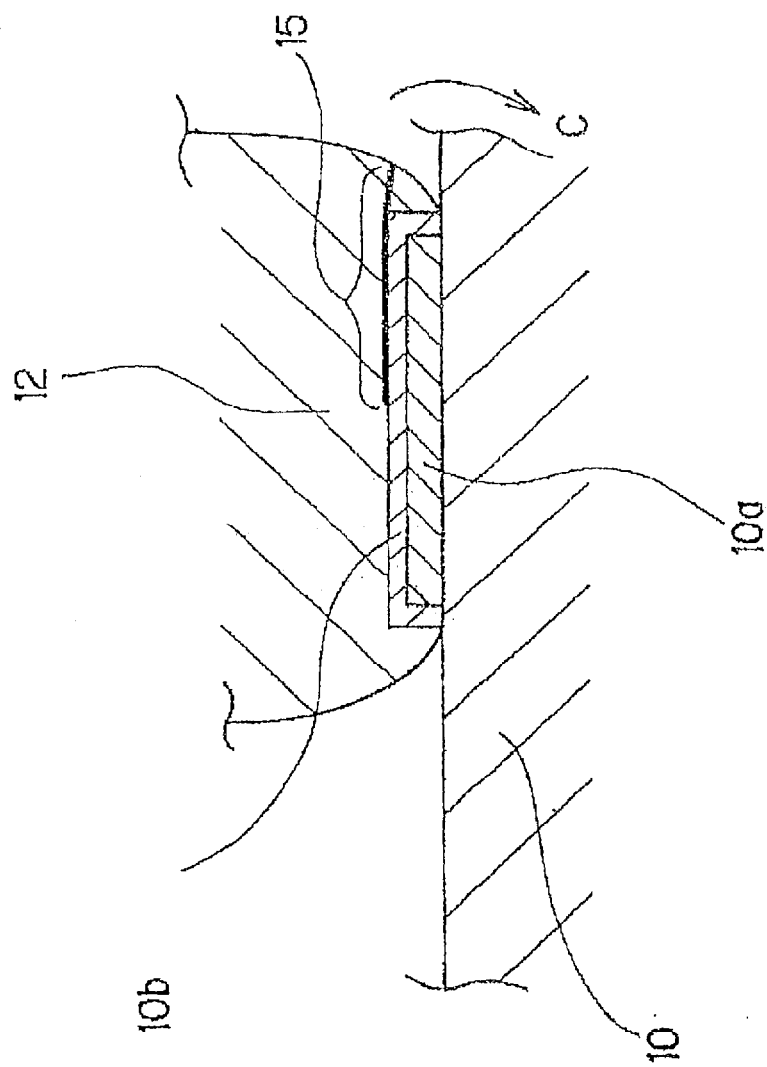
FIG. 4 is a sectional view for explaining a connection between the solder balls 12 and a plane of the conductor pattern on the printed wiring substrate 10 in the first conventional semiconductor device using the CSP.

In FIG. 4, illustrated is a connection between the solder balls 12 and a plane of the conductor pattern on the printed wiring substrate 10.

As illustrated in FIG. 4, a patterned plane (conductor) consisting of a copper wiring 10a and a nickel plating 10b formed on the copper wiring 10a is provided on the printed wiring substrate 10. The solder balls 12 are connected to predetermined positions of the patterned plane. A chemical compound on the nickel plating 10b is composed of a rigid and brittle structure. As a result, a removed portion 15 is generated, when mechanical stress C is applied in the direction depicted in FIG. 4 to the chemical compound on the nickel plating 10b. This causes a remove 14a, as illustrated in FIG. 3A or another remove 14b, as illustrated in FIG. 3B. If such removes 14a or 14b are caused, it cannot be expected that the reinforcing pads 13a through 13d can release stress applied on soldered portions around the reinforcing pads 13a, 13b, 13c, and 13d, respectively. Consequently, the stress turns out to be spread all over the soldered portions around the reinforcing pads 13a, 13b, 13c, and 13d. This is because each of the reinforcing pads 13a, 13b, 13c, and 13d has few areas of an acute angle portions. The stress is therefore concentrated on the acute angle portions, so that the removes 14a and 14b are easily generated.

Figure 5A:
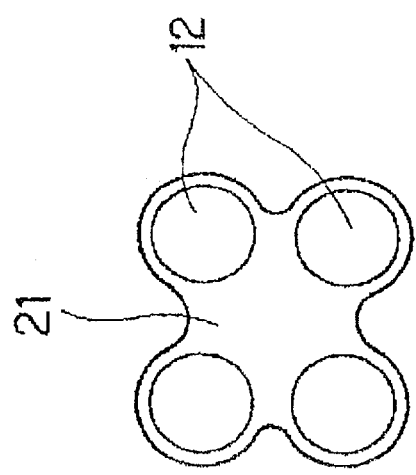
FIG. 5A is a view for schematically showing a reinforcing pad 21 consisting of a regular square in the semiconductor device using the CSP according to a preferred embodiment of the present invention.
Figure 5B:
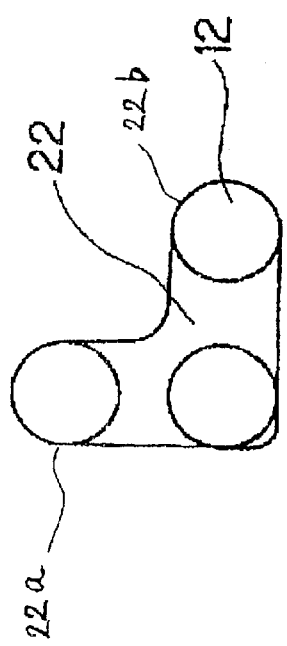
FIG. 5B is a view for schematically showing a reinforcing pad 22 consisting of a right-angled triangle in the semiconductor device using the CSP according to a preferred embodiment of the present invention.

Next, referring to FIGS. 5A and 5B, description will proceed to a semiconductor device according to a preferred embodiment of the present invention.

In the present invention, the semiconductor device according to the preferred embodiment is mounted on a principle surface (a surface on which the semiconductor device is mounted) of a substrate, such as a printed wiring substrate, and the like to be connected with a circuit formed on the principle surface. The semiconductor device comprises a body portion having a mounting surface (bottom surface), predetermined numbers of solder balls which are formed on the mounting surface (bottom surface) and which connect the semiconductor device to the principle surface of the printed wiring substrate, and the like. On corners of the bottom surface of the body portion, reinforcing pads are provided, respectively. A plurality of the solder balls are positioned (mounted) on each of the reinforcing pads. Each of the reinforcing pads has a periphery adjacent to each of the solder balls mounted thereon that is at least semicircular, when seen in plan view as in FIG. 5A.

With the structure, portions of each reinforcing pad on which at least a part of solder balls positioned the outer sides are hemmed (bordered) to have roundness in line with the outer sides of the predetermined portions of the connected planes of the above-mentioned at least a part of solder balls positioned the outer side, respectively. As a result, any acute angle portions are not produced in at least the portions of each reinforcing pad on which the solder balls positioned the outer sides are mounted. Therefore, mechanical stress applied on the reinforcing pad is not concentrated on a part of the reinforcing pad but diffused therearound. The remove of solder balls in the reinforcing pad can be reduced.

FIGS. 5A and 5B show structures of reinforcing pads of the semiconductor device according to the preferred embodiment of the present invention. FIG. 5A shows a reinforcing pad 21 consisting of a regular square. As illustrated in FIG. 5A, total four solder balls 12 are provided on the four corners of the reinforcing pad 21, respectively. On the other hand, FIG. 5B shows a reinforcing pad 22 consisting of a right-angled triangle. As illustrated in FIG. 5B, total three solder balls 12 are provided on the three corners of the reinforcing pad 22, respectively. In FIGS. 5A and 5B, only each one reinforcing pad 21 or 22 is illustrated However, one CSP has four reinforcing pads, as shown in FIG. 2.

As illustrated in FIG. 5A, in the reinforcing pad 21, circumferential shapes of the portions on which the four solder balls 12 are mounted (positioned), respectively, are hemmed (bordered) to have roundness in line with outer diameters of the solder balls 12, respectively. As a result, each portion on which each solder ball 12 is mounted (positioned) has a semicircular or an elliptical shape while the reinforcing pad 21, as a whole, has a cross shape or an X-shape. As a result, any acute angle portions are not produced in the reinforcing pad 21 with respect to the solder balls 12. Therefore, compared with the reinforcing pads 13a, 13b, 13c, and 13d of the first conventional semiconductor device mentioned above, stress applied on each of the four solder balls 12 is not concentrated on a single portion but diffused around the portion on which each solder ball 12 is mounted (positioned). Accordingly, junction plane by soldering can be prevented from being removed, in other words, the solder balls 12 can be prevented from being removed in the reinforcing pad 21.

On the other hand, in the reinforcing pad 22, similarly to those of the reinforcing pad 21, circumferential shapes of the portions on which the four solder balls 12 are mounted (positioned), respectively, are hemmed (bordered) in line with outer diameters of the solder balls 12, respectively, as illustrated in FIG. 5B. As a result, both end portions 22a and 22b are processed halfway round the solder balls 12, respectively. The reinforcing pad 22, as a whole, has an L-shape, a V-shape, or one of Japanese letters " "-shape. As a result, any acute angle portions are not produced in the reinforcing pad 22 with respect to the solder balls 12. Therefore, compared with the reinforcing pads 13a, 13b, 13c, and 13d of the first conventional semiconductor device mentioned above, stress applied on each of the three solder balls 12 is not concentrated on a single portion but diffused around the portion on which each solder ball 12 is mounted (positioned). Accordingly, junction plane by soldering can be prevented from being removed, in other words, the solder balls 12 can be prevented from being removed in the reinforcing pad 22.

As described above, in the semiconductor device according to the preferred embodiment of the present invention, circumferential shapes of the portions on the reinforcing pad 21 or 22 on which at least outer side solder balls 12 are mounted (positioned), respectively, are hemmed (bordered) to have roundness in line with outer diameters of the solder balls 12, respectively. As a result, any acute angle portions are not produced in the reinforcing pad 21 or 22. Therefore, mechanical stress applied on the reinforcing pad 21 or 22 is not concentrated but diffused therearound. The remove of solder balls in the reinforcing pad 21 or 22 can be reduced. Stress applied on soldered portions around the reinforcing pad 21 or 22 can be released. Accordingly, the reinforcing pad 21 or 22 becomes capable of performing its original meritorious effect.

While this invention has thus far been described in conjunction with a preferred embodiment thereof, it will now be readily possible for one skilled in the art to put this invention into effect in various other manners.

For example, in the preferred embodiment mentioned above, description was made about remove of a solder junction plane due to mechanical force. However, the semiconductor device of the present invention is effective with respect to stress caused by a change of temperature, and the like, namely thermal stress, and the like.

Further, in the preferred embodiment mentioned above, description was made about only the CSP as a semiconductor device, the present invention can be applied to the semiconductor device using BGP (Ball Grid Array) or face-down bonding, such as chip size package, chip scale package, or the like.

Moreover, in the preferred embodiment mentioned above, description was made about only the reinforcing pads 21 and 22, the former has four solder balls 12 while the latter has three solder balls 12. Numbers of the solder balls can be not fewer than two, namely, the numbers of the solder balls can be two, five, and so on. In any case, by making circumferential shapes of the portions on the reinforcing pad on which at least outer side solder balls are mounted (positioned) be hemmed (bordered) to have roundness in line with outer diameters of the solder balls, respectively, the reinforcing pad is adjusted to have no acute angle portions. Accordingly, the present invention can be achieved.

What is claimed is:

1. A semiconductor device having a mounting surface attached to a circuit board, the device comprising:

plural reinforcing pads on said mounting surface of said semiconductor device that are each adjacent to a respective corner of said mounting surface; and plural first solder balls on each of said reinforcing pads, each of said plural first solder balls separately attaching the semiconductor device to the circuit board, wherein said reinforcing pads each have a respective periphery adjacent to each respective one of said plural first solder balls that, when seen in a plan view of said mounting surface, is at least semicircular.

2. The device of claim 1, wherein said reinforcing pads are generally X-shaped and have four of said first solder balls thereon, each of said four first solder balls being at a respective distal end thereof.

3. The device of claim 1, wherein said reinforcing pads are generally V-shaped and have at least two of said first solder balls thereon, each of said at least two first solder balls being at a respective distal end thereof.

4. The device of claim 1, further comprising plural second solder balls on said mounting surface and not on said reinforcing pads.

5. The device of claim 1, wherein said periphery of said reinforcing pads adjacent to said plural ones of said first solder balls, when seen in the plan view of said mounting surface, is no more than semicircular.

6. A semiconductor device having a mounting surface attached to a circuit board, the device comprising:

plural reinforcing pads on said mounting surface of said semiconductor device that are each adjacent to a respective corner of said mounting surface; and plural first solder balls on each of said reinforcing pads, each of said plural first solder balls separately attaching the semiconductor device to the circuit board, wherein said reinforcing pads each have a respective periphery adjacent to each respective one of said plural first solder balls that has a roundness in line with an outer diameter of said respective first solder ball and that, when seen in a plan view of said mounting surface, is at least semicircular, and wherein each of said reinforcing pads is generally X-shaped and has four of said first solder balls thereon, each of said four first solder balls being only at a respective distal end thereof.

7. A semiconductor device having a mounting surface attached to a circuit board, the device comprising:

plural reinforcing pads on said mounting surface of said semiconductor device that are each adjacent to a respective corner of said mounting surface; and plural first solder balls on each of said reinforcing pads, each of said plural first solder balls separately attaching the semiconductor device to the circuit board, wherein said reinforcing pads each have a respective periphery adjacent to each respective one of said plural first solder balls that has a roundness in line with an outer diameter of said respective first solder ball and that, when seen in a plan view of said mounting surface, is at least semicircular, and wherein each of said reinforcing pads is generally V-shaped and has at least two of said first solder balls thereon, each of said at least two first solder balls being only at a respective distal end thereof.

* * * * *